United States Patent [19]

Jandu

[11] Patent Number: 5,812,595
[45] Date of Patent: Sep. 22, 1998

[54] WAVEFORM SHAPING CIRCUIT FOR A MULTIPLEXED INFORMATION BUS TRANSMITTER

[75] Inventor: Jaswinder Jandu, Austin, Tex.

[73] Assignee: Motorola, Inc., Schaumburg, Ill.

[21] Appl. No.: 672,732

[22] Filed: Jul. 1, 1996

[51] Int. Cl.[6] .............................. H04B 1/38; H04B 15/00; H03K 19/0175; H03K 17/00
[52] U.S. Cl. .......................... 375/219; 375/285; 327/100; 326/90
[58] Field of Search ..................................... 375/219, 285, 375/296, 220, 222, 295; 327/100, 108; 326/90, 89, 29; 455/500, 39

[56] References Cited

U.S. PATENT DOCUMENTS

| | | | |
|---|---|---|---|
| 3,906,366 | 9/1975 | Minami et al. ........................ | 375/238 |
| 4,727,570 | 2/1988 | Tarbouriech ........................... | 379/361 |
| 5,010,332 | 4/1991 | Egami ................................... | 340/825.5 |
| 5,153,466 | 10/1992 | Stein et al. ............................. | 375/219 |
| 5,194,761 | 3/1993 | Smith .................................... | 307/264 |
| 5,210,772 | 5/1993 | Nakagawa .............................. | 375/204 |

*Primary Examiner*—Chi H. Pham
*Assistant Examiner*—Khai Tran
*Attorney, Agent, or Firm*—Daniel D. Hill; J. Gustav Larson

[57] ABSTRACT

A waveform shaping circuit (120) provides a shaped variable pulse width modulation signal (VPWM) for an SAE (Society of Automotive Engineers) J1850 compliant bus. The J1850 specification defines a single wire multiplexed bus protocol for an automotive application. A counter logic circuit (440) receives a variable pulse width modulation signal (VPWM) signal having unshaped rising and falling edges and a clock having a period smaller than a desired rise or fall time. The counter logic circuit (440) shapes the rising and falling edges of the VPWM signal by sequentially switching each of a variable weighted resistor string (410) to produce an unfiltered shaped VPWM signal. The unfiltered shaped VPWM signal is smoothed by a low pass filter (430) to produce a smoothed shaped VPWM signal.

18 Claims, 3 Drawing Sheets

WAVEFORM SHAPING CIRCUIT FOR A MULTIPLEXED INFORMATION BUS TRANSMITTER

FIELD OF THE INVENTION

This invention relates generally to circuits, and more particularly, to a waveform shaping circuit for a multiplexed information bus transmitter.

BACKGROUND OF THE INVENTION

Transceivers are commonly used in a variety of applications in microcontrollers and telecommunications. Transceivers have the ability to receive and transmit signals. Various design techniques are used to shape, amplify, filter and generate the signals in the transceiver. Wave shaping the signal to produce waveforms with controlled and precise rise and fall times is a key aspect for design stability and consistency. Another aspect of wave shaping is to control the amount of high frequency harmonics which may cause interference with other system components.

FIG. 2 illustrates a prior art wave shaping circuit 200 that includes a bias generator 210 and an external precision resistor 212. The bias generator 210 generates a current based on the bandgap reference voltage and the external precision resistor 212. The current will propagate through a series of P-channel transistors 221, 222, 231, and 232 and N-channel transistors 223, 224, 233, and 234 and capacitors 242 and 244 to produce an output waveform labeled "$V_{OUT}$" that is a delayed and wave shaped version of an input waveform labeled "$V_{IN}$". A relationship between the external precision resistor 212 and capacitors 242 and 244 determines the rise and fall times of output voltage $V_{OUT}$. Variations in the capacitance values of capacitors 242 and 244 due to variations in process and temperature, the tolerance of external resistor 212, and the variability of the V-I (voltage-current) process in the bias generator cause variations in the rise and fall time of output voltage $V_{OUT}$. Also, the requirement for a precision external resistor 212 adds cost to the transceiver using prior art wave shaping circuit 200.

FIG. 3 illustrates a prior art wave shaping circuit 300 that includes a current steering amplifier 310 for wave shaping an input voltage labeled "$V^{IN}$". A current source 330 provides an exponential rise and fall current that is triggered by the input voltage $V_{IN}$. Based on the voltage of $V_{IN}$, the current is directed (steered) through transistors 311, 312, 313, and 314 to an integrator 320. The integrator 320 includes a capacitor which produces an output voltage labeled "$V_{OUT}$" that is a delayed and wave shaped version of input voltage $V_{IN}$. Output voltage $V_{OUT}$ has different rise and fall times in respect to input voltage $V_{IN}$.

A potential problem with wave shaping circuit 300 is imprecise, or inadequate, control of the exponential rise and fall current provided by current source 330, caused by process and temperature variations. Also, an external resistor (not shown) may be required to control a bias voltage for current source 330. In addition, the circuitry required to generate the exponential current is difficult to design, and may require a large surface area to implement. Further, the need for an external component increases the size and cost of a system including wave shaping circuit 300. Also, a capacitor that performs the integration in integrator 320 will be affected by process variations which may cause an undesirable variation of output voltage $V_{OUT}$, and affect the precision of the rise and fall times of $V_{OUT}$.

DESCRIPTION OF A PREFERRED EMBODIMENT

Generally, the present invention provides a shaped variable pulse width modulation signal (VPWM) for an SAE (Society of Automotive Engineers) J1850 compliant bus. The J1850 specification defines a single wire multiplexed bus protocol for an automotive application. A counter logic block receives a variable pulse width modulation (VPWM) data signal having unshaped rising and falling edges and a clock having a period smaller than a desired rise or fall time. VPWM signals are signals having a plurality of waveforms, where both the period and duty cycle of the individual waveforms of the plurality of waveforms can vary. The counter logic block shapes the rising and falling edges of a VPWM signal by sequentially switching one resistor of a variable weighted resistor string to produce an unfiltered shaped VPWM signal. The unfiltered shaped VPWM signal is smoothed by a low pass filter to produce a shaped VPWM signal.

Performing wave shaping in this manner provides an advantage over the prior art waveform shaping circuits in that the shaped waveform is not dependent upon any precision external components, exponential current sources or process or temperature dependent capacitors. Therefore, the need for external pins in order to access external components is eliminated. Also, because the resistance values of the resistors used in the present invention are based on a unit resistance, and weighted relative to each other, temperature and process variations do not adversely affect the shape of the output waveform.

Figure 1:
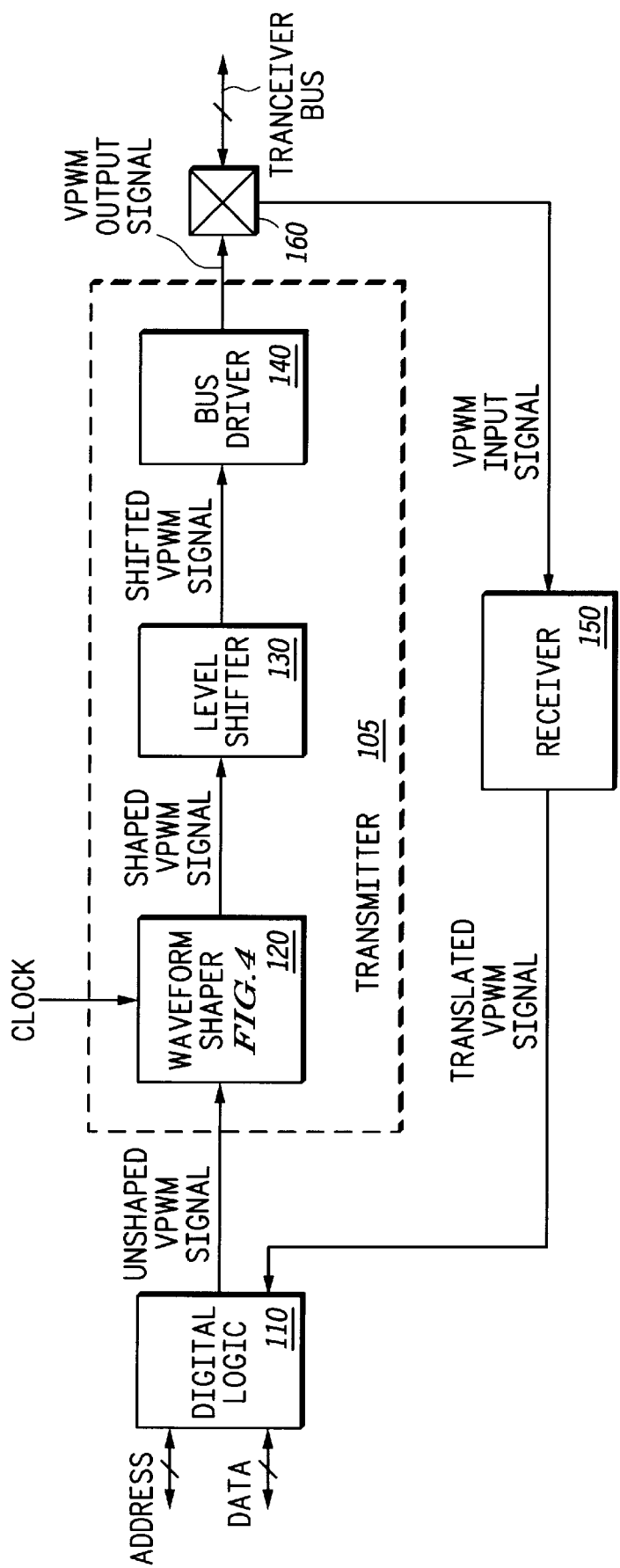
FIG. 1 illustrates, in block diagram form, a transceiver in accordance with the present invention.
Figure 2:
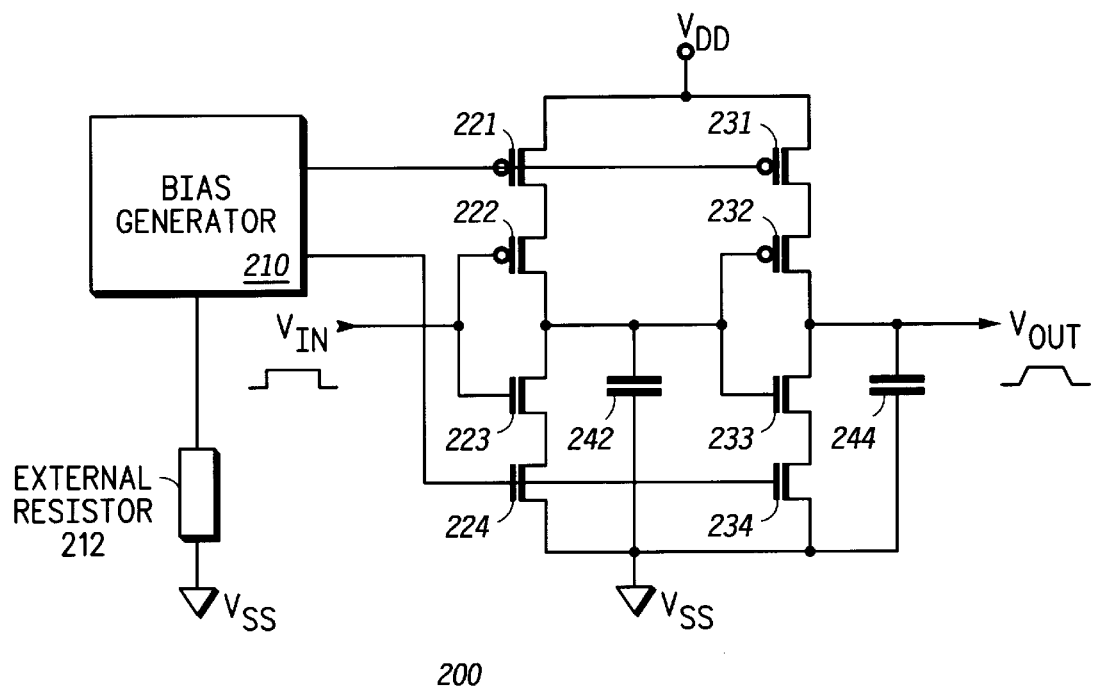
FIG. 2 illustrates, in partial block diagram form and partial schematic diagram form, a prior art waveform shaping circuit.
Figure 3:
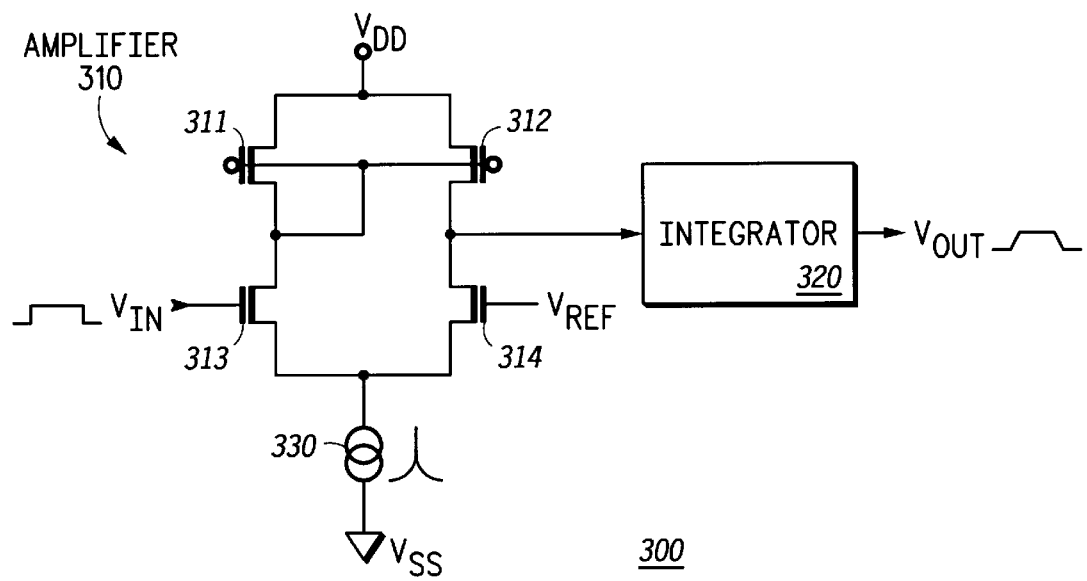
FIG. 3 illustrates, in partial block diagram form and partial schematic diagram form, another prior art waveform shaping circuit.

The present invention may be more fully described with reference to FIG. 1 and FIG. 4. FIG. 1 illustrates, in block diagram form, a transceiver 100 for interfacing to a bidirectional multiplexed bus, as defined by the SAE J1850 specification, having a single conductor. The transceiver 100 comprises a digital logic circuit 110, a transmitter 105, a receiver 150, and an input/output (I/O) pad 160. The digital logic circuit 110 receives address signals labeled "ADDRESS" and data signals labeled "DATA" from a central processing unit (CPU) (not shown), and produces an unshaped VPWM signal. The transmitter 105 comprises a waveform shaping circuit 120, a level shifter 130, and a bus driver 140. The waveform shaping circuit 120 is connected to the digital logic circuit to receive the unshaped VPWM signal, and produces a shaped VPWM signal. The level shifter 130 is connected to waveform shaping circuit 120 to receive the shaped VPWM signal, and produces a shifted VPWM signal. The bus driver 140 is connected to the level shifter 130 to receive the level shifted VPWM signal, and produces a VPWM output signal labeled "VPWM OUTPUT SIGNAL". The I/O pad 160 is connected to a bidirectional transceiver bus, the output pad providing the VPWM output signal, and the output pad for receiving a VPWM input signal, labeled "VPWM INPUT SIGNAL", from the bidirectional transceiver bus. The receiver 150 is connected to the I/O pad 160 for receiving the VPWM input signal. Note the transceiver bus is a single wire multiplexed bus in an automobile for carrying VPWM output signal information, and may include other transceivers in addition to transceiver 100. In other embodiments, the transceiver bus may include multiple conductors.

In operation, the digital logic circuit 110 is used to prepare data received from the CPU for the transmitter 105, and to prepare data received from receiver 150 for presentation to the CPU (not shown). When transmitter 105 transmits, the digital logic circuit 110 receives unshaped VPWM data signals. Based on the data received from the CPU, the digital logic circuit 110 will create an unshaped VPWM signal having appropriate periods and duty cycles. The unshaped VPWM signal is a digital logic signal having a logic high level and a logic low level. The VPWM data signal from the digital logic circuit 110 is unshaped, meaning that the transition rate between a logic high level and a logic low level, or conversely a logic low level and a logic high level, is substantially uncontrolled, in that it occurs in a very short period of time that is a function of the switching characteristics of transistors (not shown) within the digital logic circuit 110. As such, the unshaped VPWM data signal has high frequency harmonics associated with it that are undesirable within a bus that conforms to the SAE J1850 specification, which may lead to radio frequency inference (RFI).

The unshaped VPWM data signal is received by the waveform shaping circuit 120. The waveform shaping circuit 120 converts the substantially uncontrolled transition rate of the unshaped VPWM data signal to have a shaped, also known as smoothed or controlled, rise and fall time meeting the SAE J1850 specification. As part of controlling the transition of the unshaped VPWM data signal to the shaped VPWM data signal, the waveform shaping circuit 120 controls the rise and fall time, and the rounding of the shaped VPWM signal. The rounding of the VPWM data signal refers to the relative rate transition between logic levels. For example, it may be desirable to allow for a smaller rate of voltage change near each logic level than at the midpoint between logic levels. For example, for a logic low level of zero volts and a high logic level of five volts, it may be desirable to transition at a slower rate between zero and one volt than from one volt to four volts, while transitioning slowly again from four to five volts. One skilled in the art will recognize that it is desirable for the change in rates of transition to be gradual, and to avoid sharp transition points. There may be sharp transition points with piecewise-linear models, which may allow for high frequency harmonics to be introduced.

Level shifter 130 receives the shaped VPWM data signal and performs a voltage level shifting function to increase the amplitude of the shaped VPWM data signal in order to meet the J1850 specification. The shifted signal is referred as the shifted VPWM data signal and is used to level shift the shaped VPWM signal from a rail-to-rail voltage of 5 volts to a rail-to-rail voltage of 7.5 volts. Note that level shifter 130 is not needed in applications where only one power supply voltage is used.

The bus driver 140 receives the shifted VPWM data signal and provides output buffering for the shifted VPWM data signal to the transceiver bus through I/O pad 160.

Conversely, during a receive portion, the VPWM input signal is received by the receiver 150 from the transceiver bus through I/O pad 160. The receiver 150 translates the received VPWM input signal into a logic level signal labeled "TRANSLATED VPWM SIGNAL" to the digital logic block 110.

Figure 4:
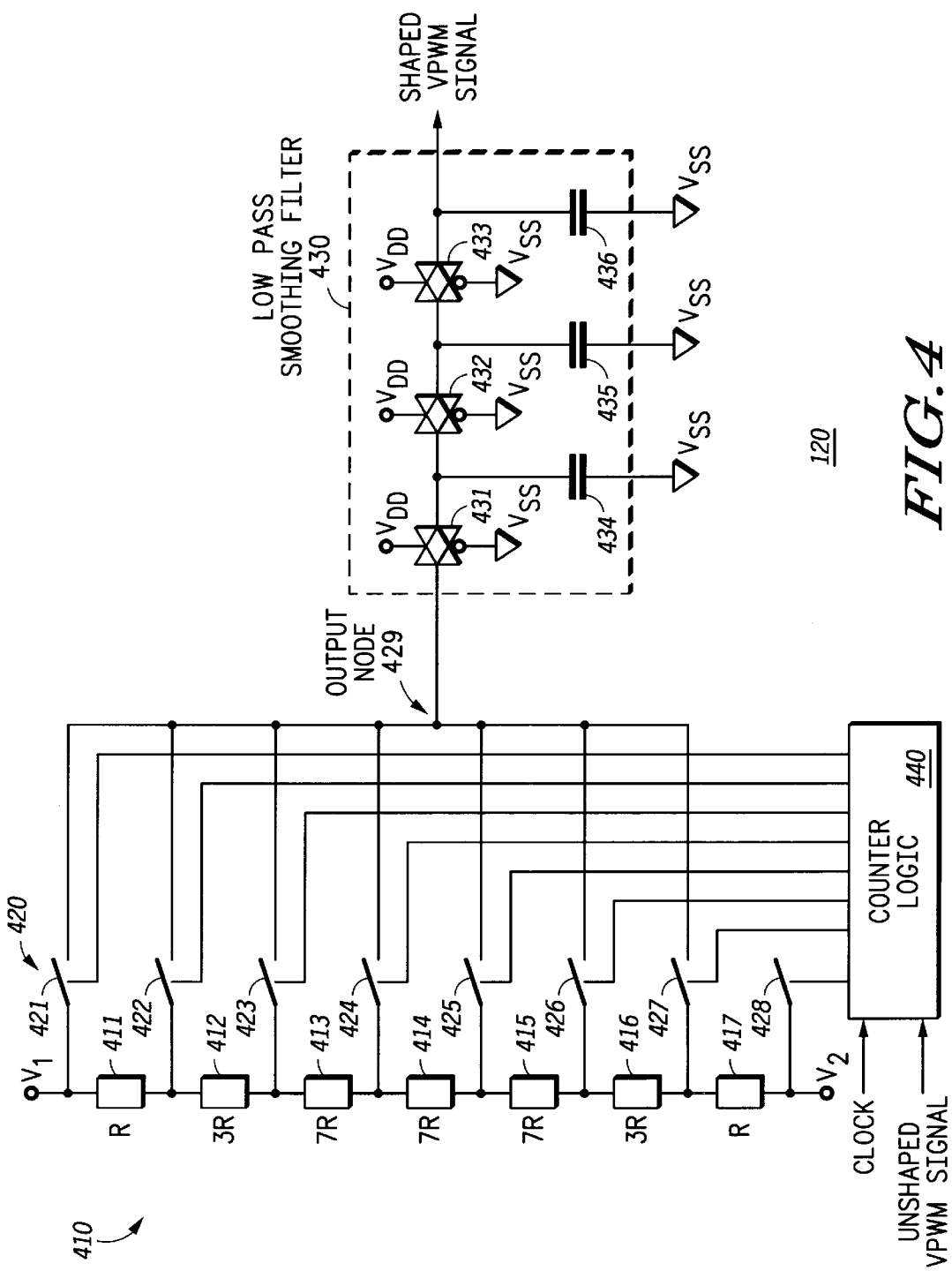
FIG. 4 illustrates, a waveform shaping circuit in accordance with the present invention.

FIG. 4 illustrates a waveform shaping circuit 120 in accordance with the present invention. Waveform shaping circuit 120 comprises a variable weighted resistive element string 410, a plurality of switches 420, a counter logic block 440, and a smoothing filter 430. In the illustrated embodiment, smoothing filter 430 is a low pass filter. The variable weighted resistive element string 410 is connected to a supply voltage terminal labeled "V1", a supply voltage terminal labeled "V2", and to the plurality of switches 420. In the illustrated embodiment, V1 receives the positive power supply voltage and V2 is connected to a chassis ground in an automobile. In other embodiment, V1 and V2 may be any supply voltage that provides the necessary logic levels for the application.

In the illustrated embodiment, the variable weighted resistive element string 410 includes a plurality of series-connected resistors 411–417. Polysilicon resistors are used having a relatively low resistance value. Each of the series-connected resistors has a different relative weighting associated with it. By way of example, the end resistive elements 411 and 417 are illustrated in FIG. 4 having a weighting of R, resistive elements 412 and 416 have a waiting of 3R, and resistive elements 413–415 have a waiting of 7R, where R represents a resistance value in ohms. In this embodiment, the relative weighting of the resistance values provides a symmetrically shaped transition of the VPWM data signal from the low voltage level to the high voltage level and from the high voltage level to the low voltage level.

The plurality of switches 420 includes switches 421 through 428. Each of switches 421 through 428 has a first terminal, a second terminal, and a control terminal. Each of the second terminals of switches 421 through 428 are connected to form output node 429. Each of the control terminals of switches 421 through 428 are connected to the counter logic block 440. The first terminal of switch 421 is connected to the node common to resistor 411 and a first supply voltage terminal labeled "$V_1$". The first terminal of switch 422 is connected to the node common to resistor 411 and 412. The first terminal switch 423 is connected to the node common to resistor 412 and 413. The first terminal of switch 424 is connected to the node common to resistors 413 and 414. The first terminal of switch 425 is connected to the node common to resistor 414 and 415. The first terminal of switch 426 is connected to the node common to resistors 415 and 416. The first terminal of switch 427 is connected to the node common to switch 416 and 417. The first terminal of switch 428 is connected to the node common to resistor 417 and a second supply voltage terminal labeled "$V_2$". $V_1$ and $V_2$ may receive the power supply voltage, for example $V_{DD}$ and $V_{SS}$ respectively. Switches 421–428 may be conventional transmission gates including P-channel and N-channel MOS (metal oxide semiconductor) transistors.

Output node 429 provides the shaped VPWM data signal, and is connected to a low pass smoothing filter 430. The low pass smoothing filter 430 comprises a plurality of low pass filters for smoothing the transition of the shaped VPWM, which occurs in steps as discussed below. A first low pass filter comprises transmission gate 431 and capacitor 434, a second low pass filter comprises transition gate 432 and capacitor 435, and a third low pass filter comprises transmission gate 433 and capacitor 436. Transmission gates 431, 432, and 433 are conventional transmission gates, and each includes parallel-connected P-channel and N-channel transistors. In transmission gate 431, an N-channel transistor has a first current electrode (drain/source) connected to output node 429, a control electrode (gate) connected to a power supply voltage terminal labeled "$V_{DD}$", and a second current electrode (drain/source) connected to an input terminal of transmission gate 432. A P-channel transistor is connected in parallel with the N-channel transistor in transmission gate 431 with its gate connected to a second power supply voltage terminal labeled "$V^{ss}$". Capacitor 434 has a first plate electrode connected to the second current electrodes of the parallel-connected P-channel and N-channel transistors of transmission gate 431, and a second plate electrode connected to $V_{ss}$. The other low pass filter circuits are constructed similarly.

In one embodiment of the invention, each of the plurality of low pass filters are substantially similar and provide additional smoothing to the shaped VPWM data signal. By combining a plurality of low pass filters in series, as shown in smoothing filter 430, increased smoothing is obtained by filtering out additional high frequency harmonics. For example, if desirable to allow signals below 7 kilohertz (kHz), the smoothing filter 430 could be used to block any frequencies above 7 kHz. A plurality of low pass filters are used to increase the cut off rate of the shaped VPWM signal. In one embodiment, 31 resistors and 32 switches are used, the resistance values of the resistors may be chosen such that the output signal transition closely approximates the 90 degree portion of a sine wave starting from the lowest amplitude point of the sine wave to the highest amplitude point. In other embodiments, any transition shape may be created.

Counter logic block 440 is coupled to a control terminal of each switch of the plurality of switches 420, and controls the signal produced at output node 429 by sequentially closing the individual switches 421–428 of the plurality of switches 420 for a predetermined time, where the predetermined time is one period of dock signal CLOCK. The stability of clock signal CLOCK is important for generating an accurate transition shape. In one embodiment, where a shaped waveform is desired, the switches 421–428 are opened and closed using "break-before-make" switching. For example, when transitioning from a low voltage level to a high voltage level, switch 428 is closed for the predetermined time and then opened, switch 427 is dosed for the predetermined time and then opened, switch 426 is closed for the predetermined time, etc. In such a manner, a shaped wave form is produced on output node 429 in a plurality of steps, where an amplitude of a step is determined by the relative resistance value of the corresponding resistive element. It is understood however, that a plurality of switches could be simultaneously closed, resulting in a variable voltage division function. Also, the predetermined time that each switch is closed may be varied for different switches, allowing transitions to be accurately shaped for a particular application.

Waveform shaping circuit 120 provides an advantage over the prior art waveform shaping circuits in that the shaped waveform is not dependent upon any precision external components, exponential current sources, or process or temperature dependent capacitors. Therefore, the need for external pins in order to access external components is eliminated. Also, because the resistance values of the resistors are based on a unit resistance, and weighted relative to each other, temperature and process variations do not adversely affect the shape of the output waveform.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A transceiver, comprising:
    a digital logic circuit for providing a digital logic signal;
    a transmitter, coupled to the digital logic circuit, the transmitter comprising:
        a waveform shaping circuit having a variable weighted resistive element string, the variable weighted resistive element string having a plurality of series-connected resistive elements, the waveform shaping circuit for receiving the digital logic signal and for generating a waveform shaped digital logic signal, wherein a transition of the waveform shaped digital logic signal from a first voltage level to a second voltage level occurs in a plurality of steps, an amplitude of each step of the plurality of steps being determined by a resistance value of a corresponding resistive element of the plurality of series-connected resistive elements; and
        a bus driving circuit, coupled to the waveform shaping circuit, for receiving the waveform shaped digital logic signal, and for buffering and driving the waveform shaped digital logic signal at an output terminal of the transmitter; and
    a receiver, coupled to the output terminal and to the digital logic circuit, the receiver for receiving an input signal from the output terminal, and for providing a translated input signal to the digital logic circuit.

2. The transceiver of claim 1, wherein the waveform shaping circuit further comprises:
    a plurality of switches, a first terminal of a switch of the plurality of switches coupled to a terminal of a resistive element of the plurality of series-connected resistive elements, and a second terminal of each of the plurality of switches coupled together to form an output node; and
    a counter logic circuit, coupled to a control terminal of each switch of the plurality of switches, for causing each of the plurality of switches to be sequentially closed for a predetermined time in response to receiving a clock signal.

3. The transceiver of claim 2, wherein the waveform shaping circuit further comprises a low pass filter, for smoothing the waveform shaped digital logic signal during the transition from the first voltage level to the second voltage level.

4. The transceiver of claim 3, wherein the low pass filter comprises:
    a transmission gate including a transistor, the transistor having a first current electrode coupled to the output node, a second current electrode coupled to an information bus, and a control electrode coupled to a first power supply voltage terminal; and
    a capacitor having a first plate electrode coupled to the second current electrode of the transistor, and a second plate electrode coupled to a second power supply voltage terminal.

5. The transceiver of claim 4, wherein a first end resistive element of the plurality of series-connected resistive elements is coupled to the first power supply voltage terminal and a second end resistive element of the plurality of series-connected resistive elements is coupled to the second power supply voltage terminal.

6. The transceiver of claim 5, wherein resistance values of the plurality of series-connected resistive elements are weighted to provide a symmetrically shaped transition from the first voltage level to the second voltage level and from the second voltage level to the first voltage level.

7. The transceiver of claim 6, further comprising a level shifting circuit coupled between the waveform shaping circuit and the bus driving circuit.

8. The transceiver of claim 1, wherein the transceiver drives a multiplexed information bus.

9. A transmitter for a multiplexed information bus, comprising:
- a waveform shaping circuit for receiving a digital logic signal, and in response, providing a waveform shaped digital logic signal, the waveform shaping circuit comprising a plurality of series-connected resistive elements, wherein a transition of the waveform shaped digital logic signal from a first voltage level to a second voltage level occurs in a plurality of steps, an amplitude of each step of the plurality of steps being determined by a resistance value of a corresponding resistive element of the plurality of series-connected resistive elements; and
- a bus driving circuit, coupled to the waveform shaping circuit, for receiving the waveform shaped digital logic signal, and for buffering and driving the waveform shaped digital logic signal onto the multiplexed information bus.

10. The transmitter of claim 9, wherein the waveform shaping circuit further comprises:
- a plurality of switches, a first terminal of a switch of the plurality of switches coupled to a terminal of a resistive element of series-connected resistive elements of the variable weighted resistive element, and a second terminal of each of the plurality of switches coupled together to form an output node; and
- a counter logic circuit, coupled to a control terminal of each switch of the plurality of switches, for causing each of the plurality of switches to be sequentially closed for a predetermined time in response to receiving a clock signal.

11. The transmitter of claim 9, wherein the waveform shaping circuit further comprises a low pass filter, for smoothing the waveform shaped digital logic signal during a transition from a first voltage level to a second voltage level.

12. The transmitter of claim 11, wherein the low pass filter comprises:
- a transmission gate including a transistor, the transistor having an first current electrode coupled to receive the waveform shaped digital logic signal, a second current electrode coupled to the multiplexed information bus, and a control electrode coupled to a first power supply voltage terminal; and
- a capacitor having a first plate electrode coupled to the second current electrode of the transistor, and a second plate electrode coupled to a second power supply voltage terminal.

13. The transmitter of claim 12, wherein a first end resistive element of a plurality of series-connected resistive elements of the variable weighted resistive element string is coupled to the first power supply voltage terminal and a second end resistive element of the plurality of series-connected resistive elements is coupled to the second power supply voltage terminal.

14. The transmitter of claim 13, wherein resistance values of the plurality of series-connected resistive elements are weighted to provide a symmetrically shaped transition from the first voltage level to the second voltage level and from the second voltage level to the first voltage level.

15. A waveform shaping circuit for receiving a digital logic signal, and in response, providing a waveform shaped digital logic signal, the waveform shaping circuit comprising:
- a plurality of series-connected resistive elements, the plurality of series-connected resistive elements causing the waveform shaped digital logic signal to transition from a first voltage level to a second voltage level in a plurality of steps, an amplitude of a step of the plurality of steps being determined by a resistance value of a resistive element of the plurality of series-connected resistive elements;
- a plurality of switches, a first terminal of a switch of the plurality of switches coupled to a terminal of a resistive element of the plurality of series-connected resistive elements, and a second terminal of each of the plurality of switches coupled together to form an output node; and
- a counter logic circuit, coupled to a control terminal of each switch of the plurality of switches, for causing each of the plurality of switches to be closed for a predetermined time in response to receiving a clock signal; and
- a bus driving circuit, coupled to the waveform shaping circuit, for receiving the waveform shaped digital logic signal, and for buffering and providing the waveform shaped digital logic signal at an output terminal of the waveform shaping circuit.

16. The waveform shaping circuit of claim 15, wherein the waveform shaping circuit is part of a transmitter for driving a multiplexed information bus.

17. The waveform shaping circuit of claim 15, further comprising a level shifting circuit for level shifting the waveform shaped digital logic signal, the level shifting circuit coupled between the waveform shaping circuit and the bus driving circuit.

18. The waveform shaping circuit of claim 15, wherein the waveform shaping circuit further comprises a low pass filter, coupled to the output terminal, for smoothing the waveform shaped digital logic signal during a transition from the first voltage level to the second voltage level.

* * * * *